(12) United States Patent
Cheng et al.

(10) Patent No.: US 11,664,422 B2
(45) Date of Patent: May 30, 2023

(54) NANOSHEET TRANSISTOR WITH ULTRA LOW-K SPACER AND IMPROVED PATTERNING ROBUSTNESS

(71) Applicant: INTERNATIONAL BUSINESS MACHINES CORPORATION, Armonk, NY (US)

(72) Inventors: Kangguo Cheng, Schenectady, NY (US); Chen Zhang, Guilderland, NY (US); Xin Miao, San Jose, CA (US); Wenyu Xu, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 17/304,021

(22) Filed: Jun. 14, 2021

(65) Prior Publication Data

US 2022/0399439 A1 Dec. 15, 2022

(51) Int. Cl.
| | | |
|---|---|---|
| *H01L 29/06* | (2006.01) | |
| *H01L 29/423* | (2006.01) | |
| *H01L 29/66* | (2006.01) | |

(52) U.S. Cl.
CPC ...... *H01L 29/0673* (2013.01); *H01L 29/0649* (2013.01); *H01L 29/42392* (2013.01); *H01L 29/66553* (2013.01)

(58) Field of Classification Search
CPC ........... H01L 29/42392; H01L 29/0673; H01L 29/66553; H01L 29/78696
See application file for complete search history.

(56) References Cited

U.S. PATENT DOCUMENTS

| | | | |
|---|---|---|---|
| 9,508,829 B1 | 11/2016 | Cheng | |
| 9,960,254 B1 | 5/2018 | Bao | |
| 10,141,403 B1 | 11/2018 | Cheng | |
| 10,529,826 B1 | 1/2020 | Frougier | |
| 10,566,445 B2 | 2/2020 | Bi | |
| 10,818,792 B2 | 10/2020 | Frougier | |
| 2018/0076226 A1 | 3/2018 | Leobandung | |
| 2018/0219082 A1* | 8/2018 | Guillorn | .......... H01L 29/42392 |
| 2019/0088797 A1 | 3/2019 | Chen | |
| 2019/0221483 A1 | 7/2019 | Mulfinger | |
| 2020/0083345 A1 | 3/2020 | Canaperi | |
| 2020/0381545 A1* | 12/2020 | Chiang | ............... H01L 29/0673 |
| 2021/0273098 A1* | 9/2021 | Chang | ............... H01L 29/66553 |

FOREIGN PATENT DOCUMENTS

| | | |
|---|---|---|
| CN | 108933084 A | 12/2018 |
| KR | 20180123422 A | 11/2018 |

\* cited by examiner

*Primary Examiner* — Changhyun Yi
(74) *Attorney, Agent, or Firm* — Samuel A. Waldbaum

(57) ABSTRACT

A semiconductor device including a plurality of nanosheet transistor channels adjacent to a source/drain. An inner spacer located between each of the plurality of nanosheet transistor channels and the inner spacer wraps around the end of each of the plurality of nanosheet transistors. The source/drain is in contact with the inner spacer and each of the plurality of nanosheet transistor channels. A gate surrounding each of the plurality of nanosheet transistor channels and an electrical contact connected to the source/drain. An ultra low-k spacer located between the gate and the source/drain. The ultra low-k spacer reduces the parasitic capacitance of the nanosheet transistor.

20 Claims, 16 Drawing Sheets

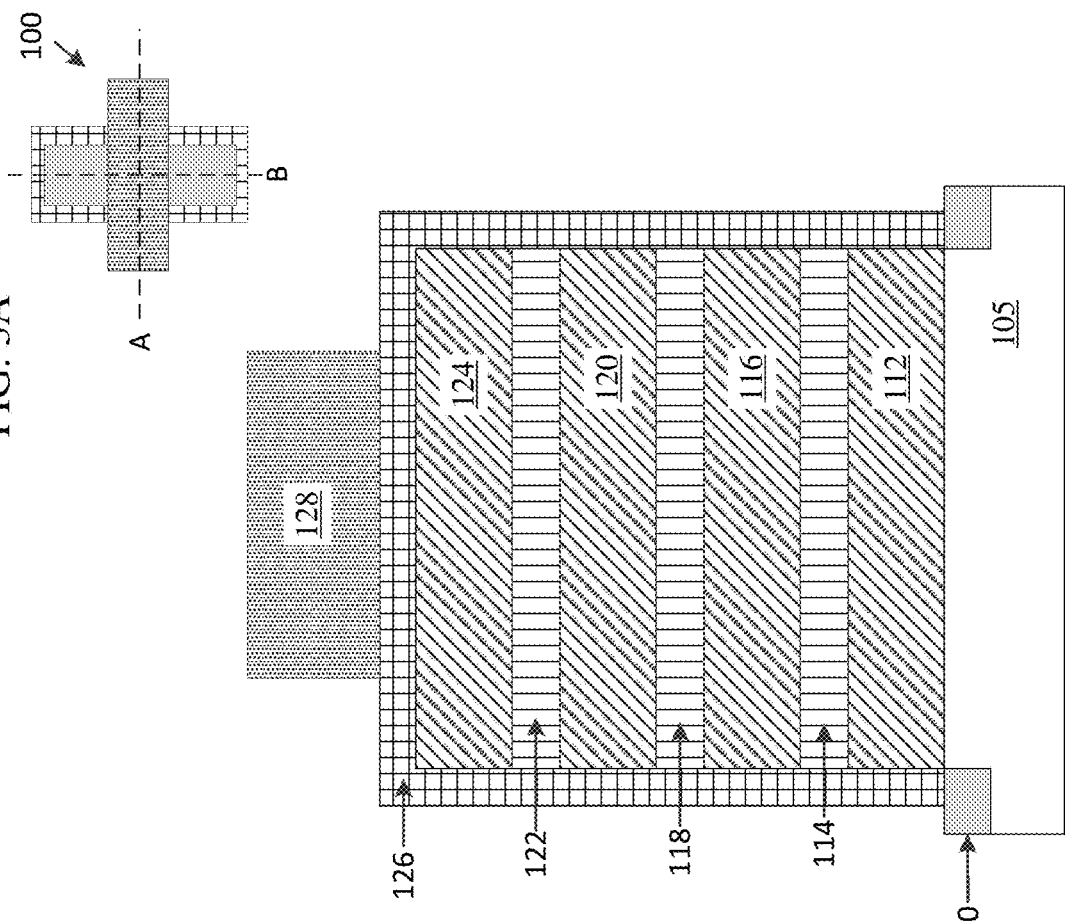
FIG. 3A
FIG. 3C
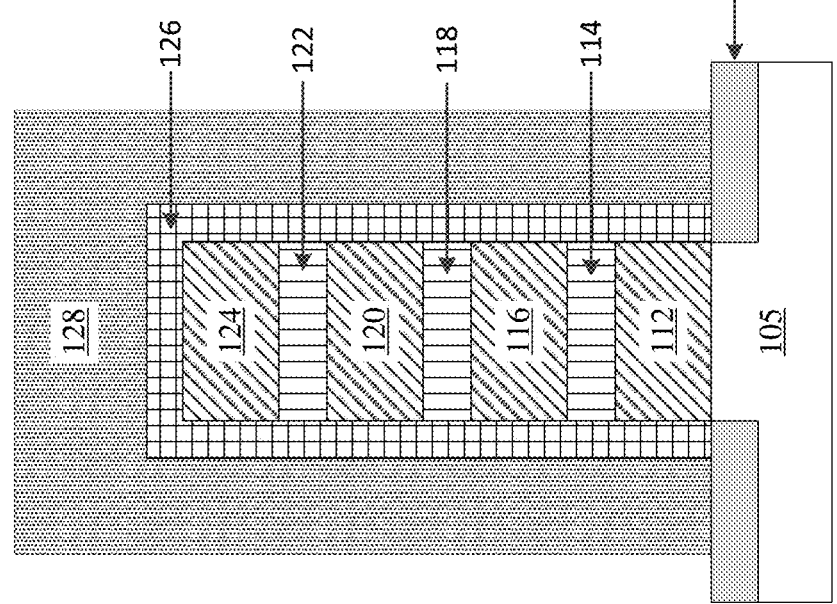
FIG. 3B

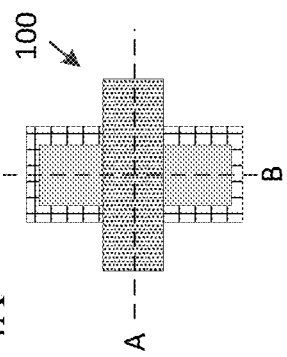
FIG. 4A
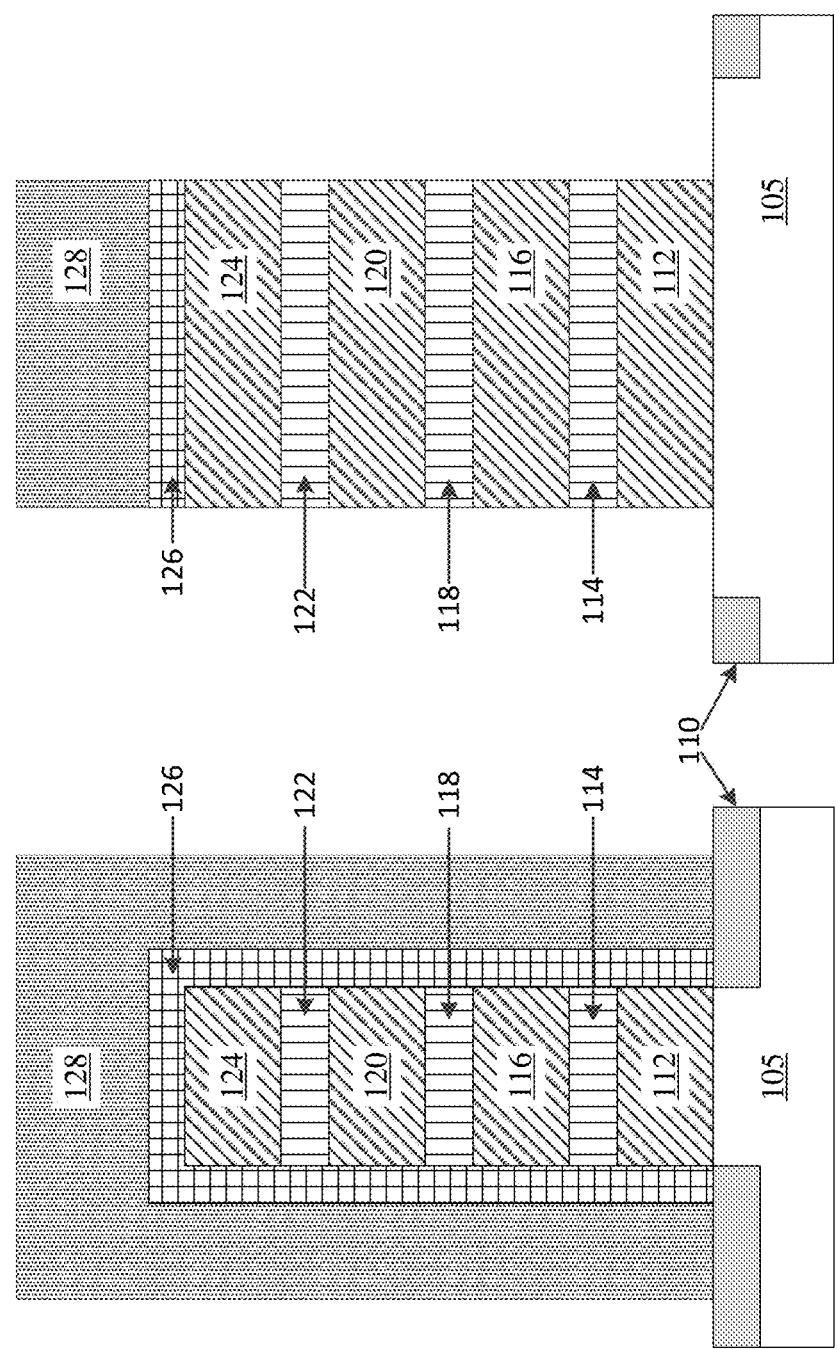
FIG. 4B
FIG. 4C

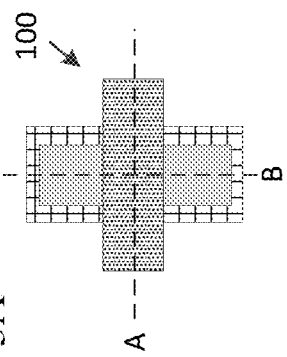
FIG. 5A
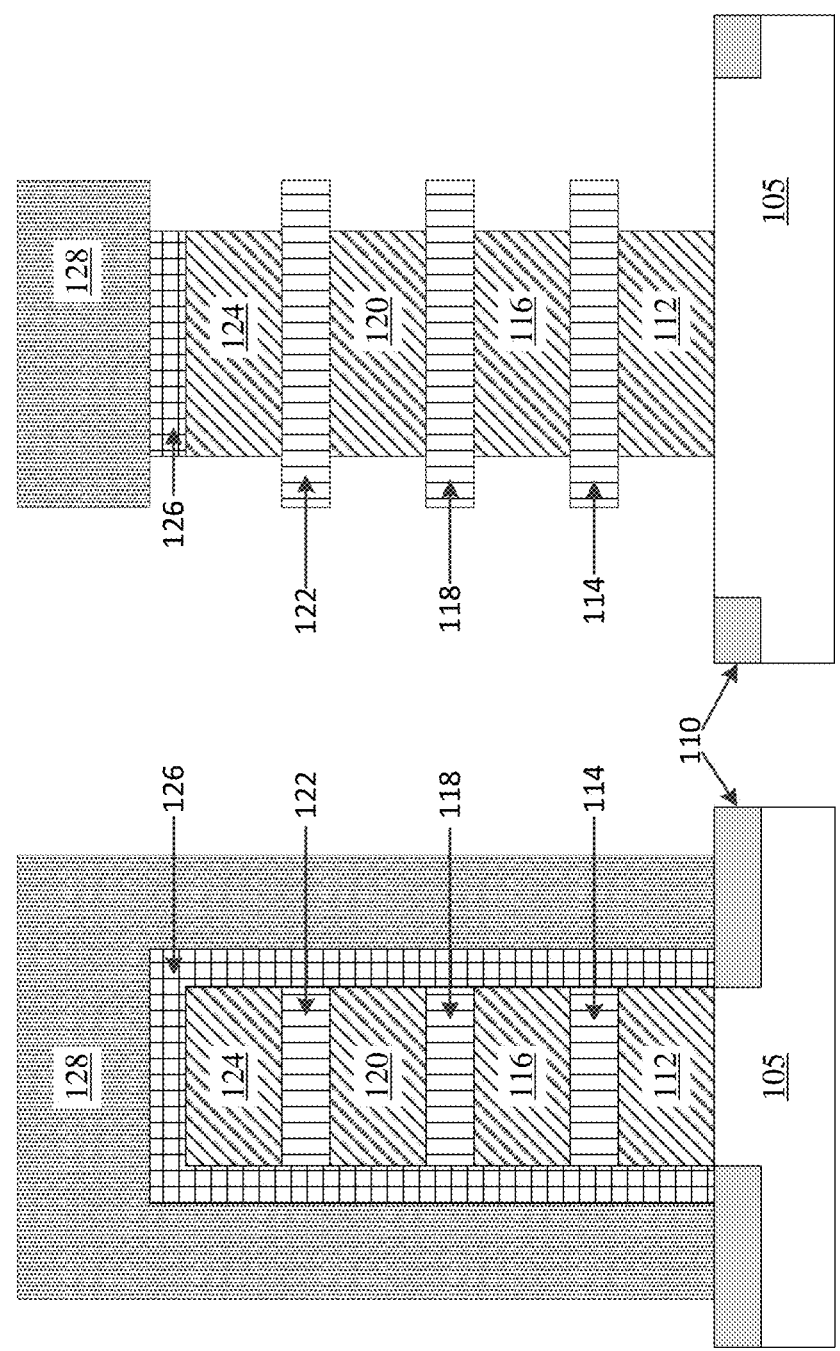
FIG. 5B
FIG. 5C

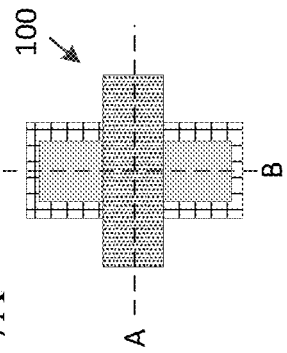
FIG. 7A
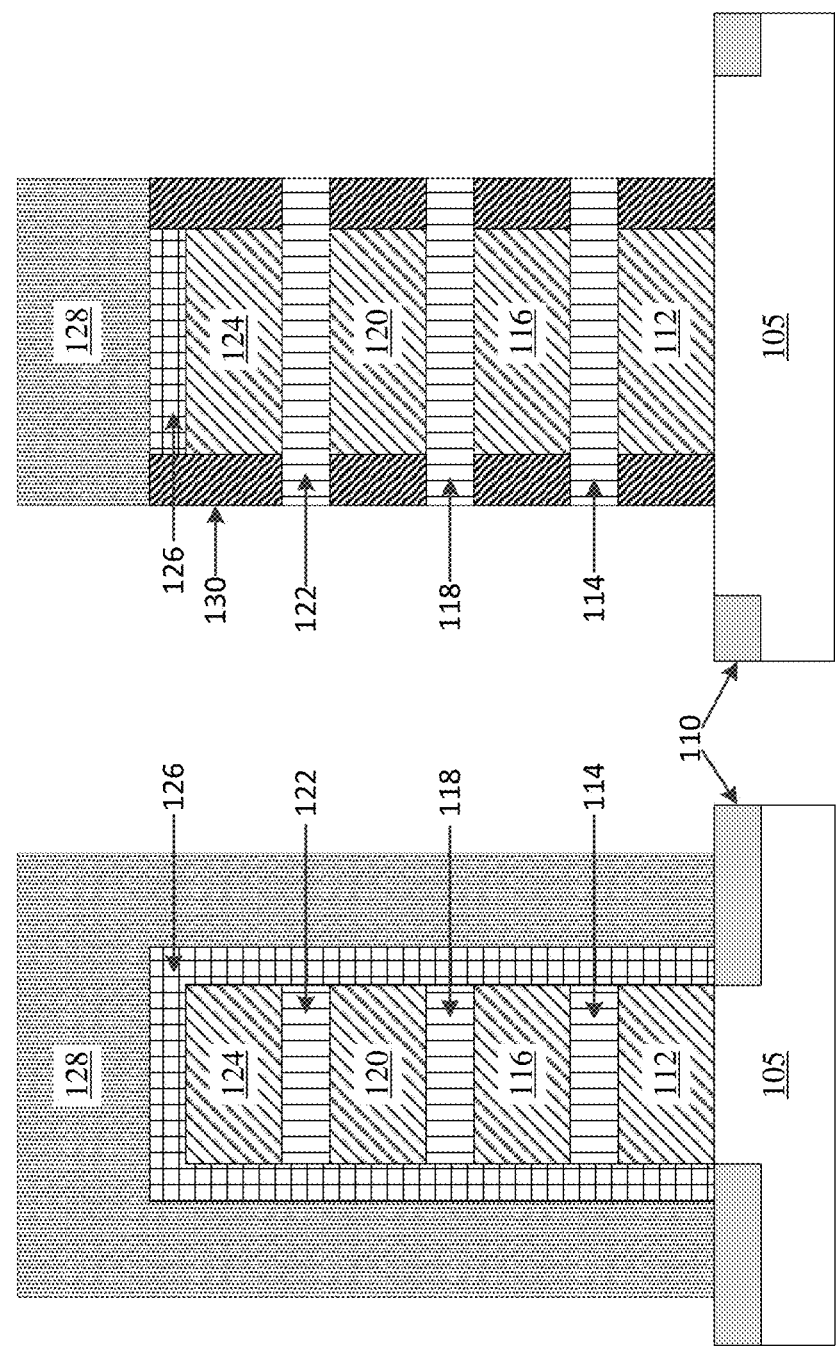
FIG. 7B
FIG. 7C

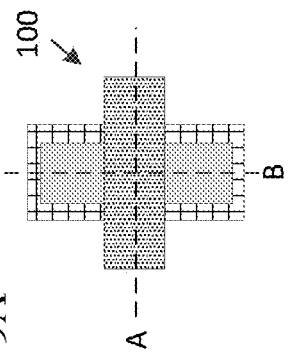
FIG. 9A
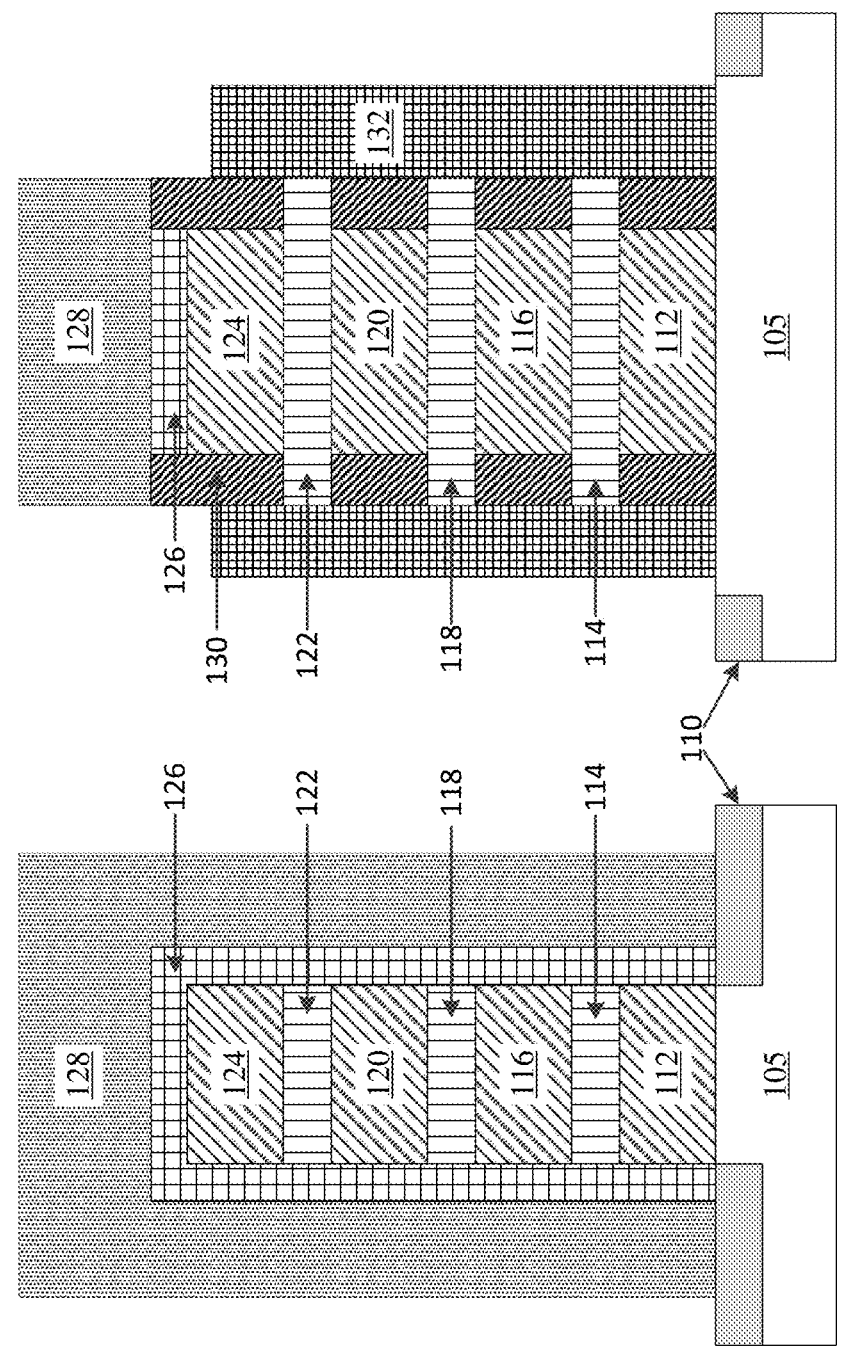
FIG. 9B
FIG. 9C

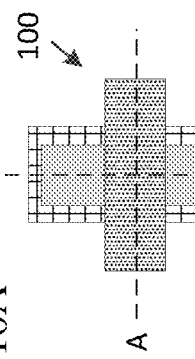
FIG. 10A
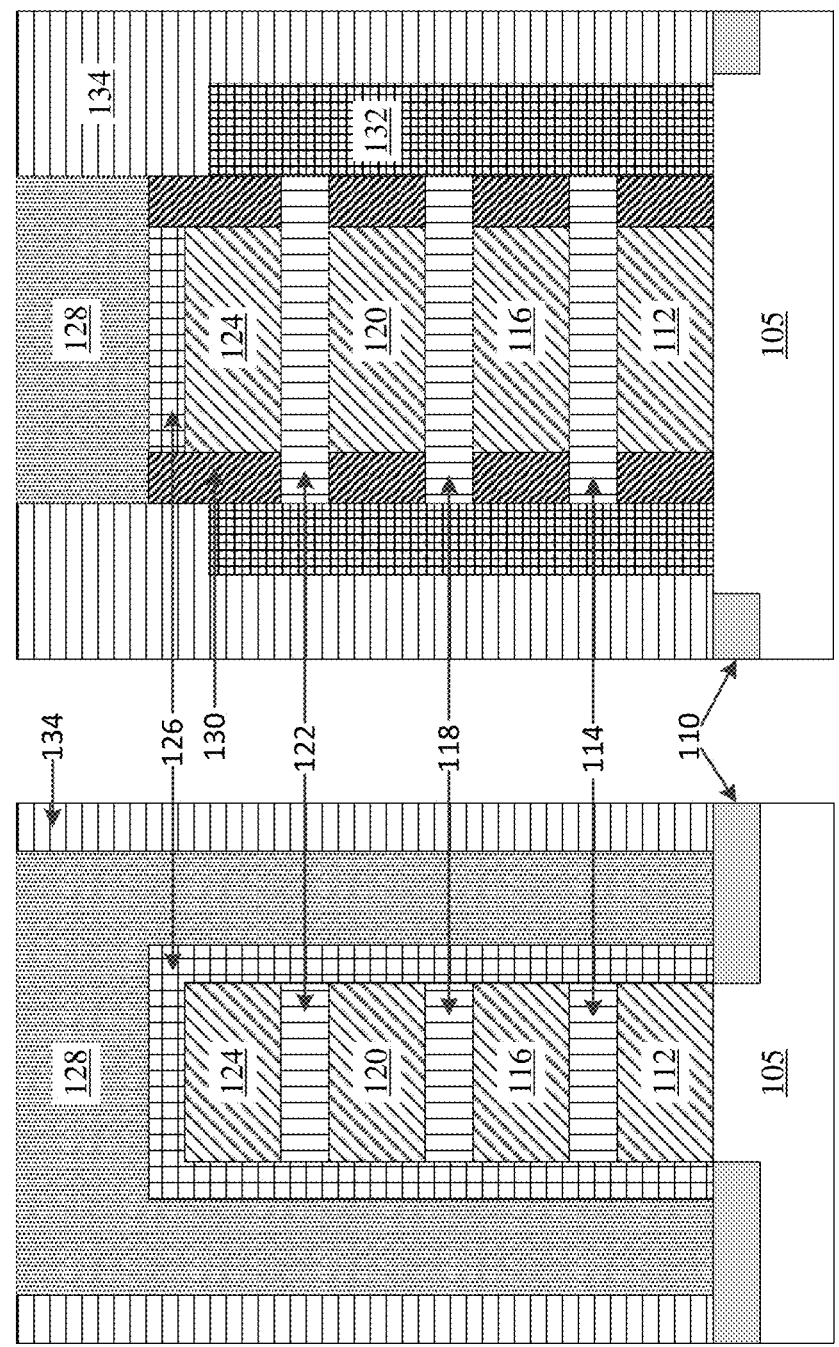
FIG. 10B
FIG. 10C

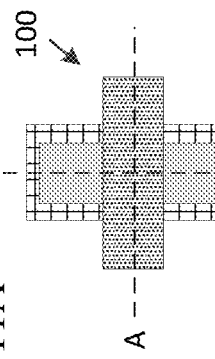
FIG. 11A
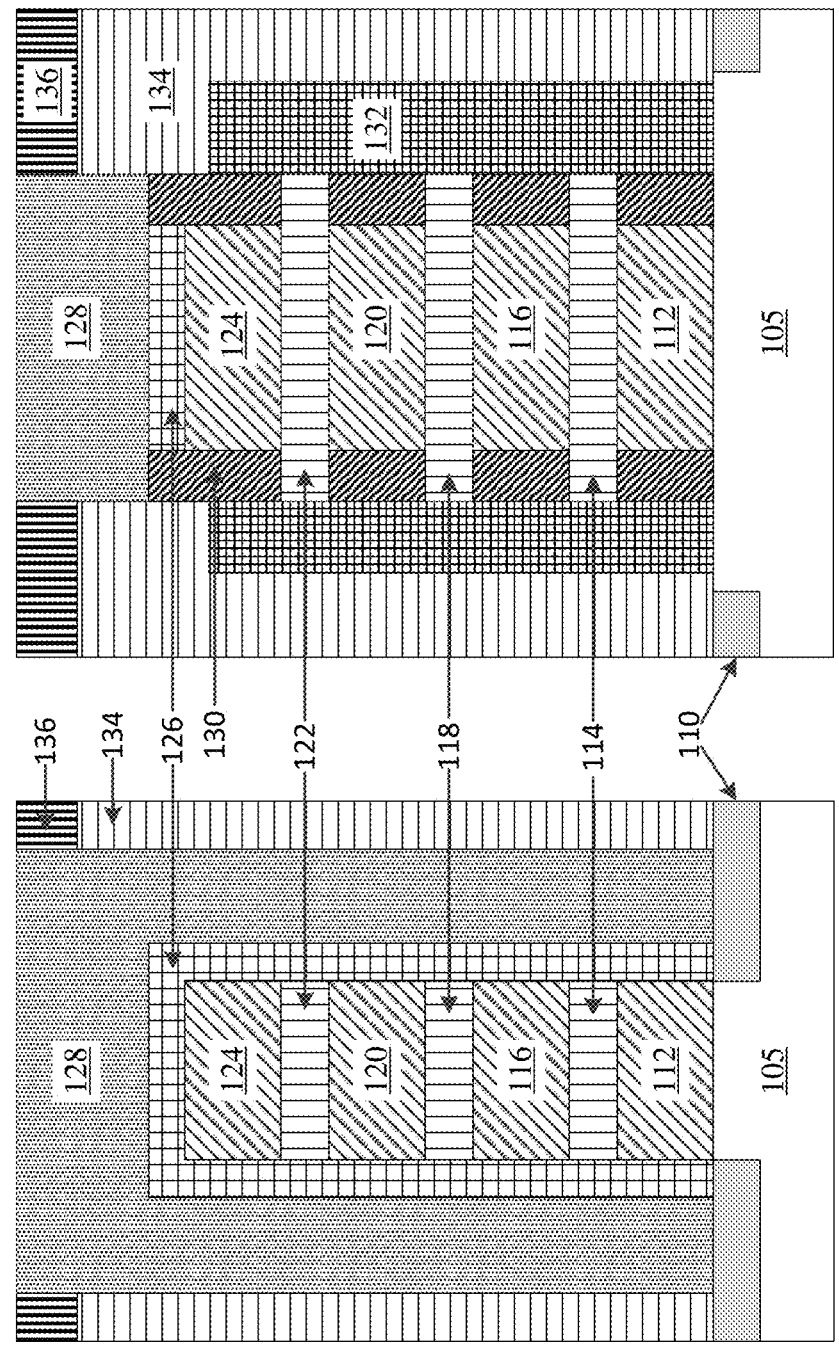
FIG. 11B
FIG. 11C

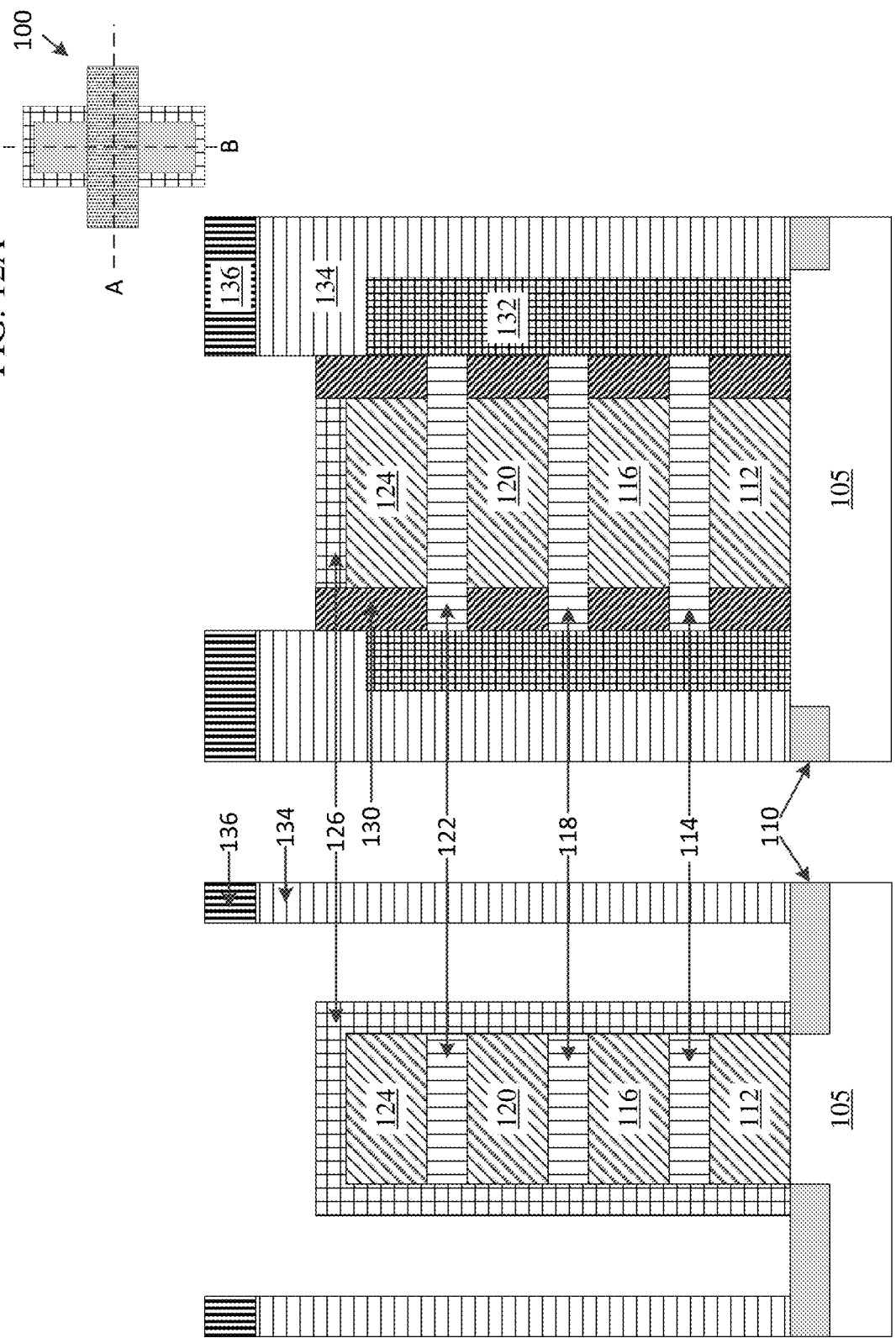

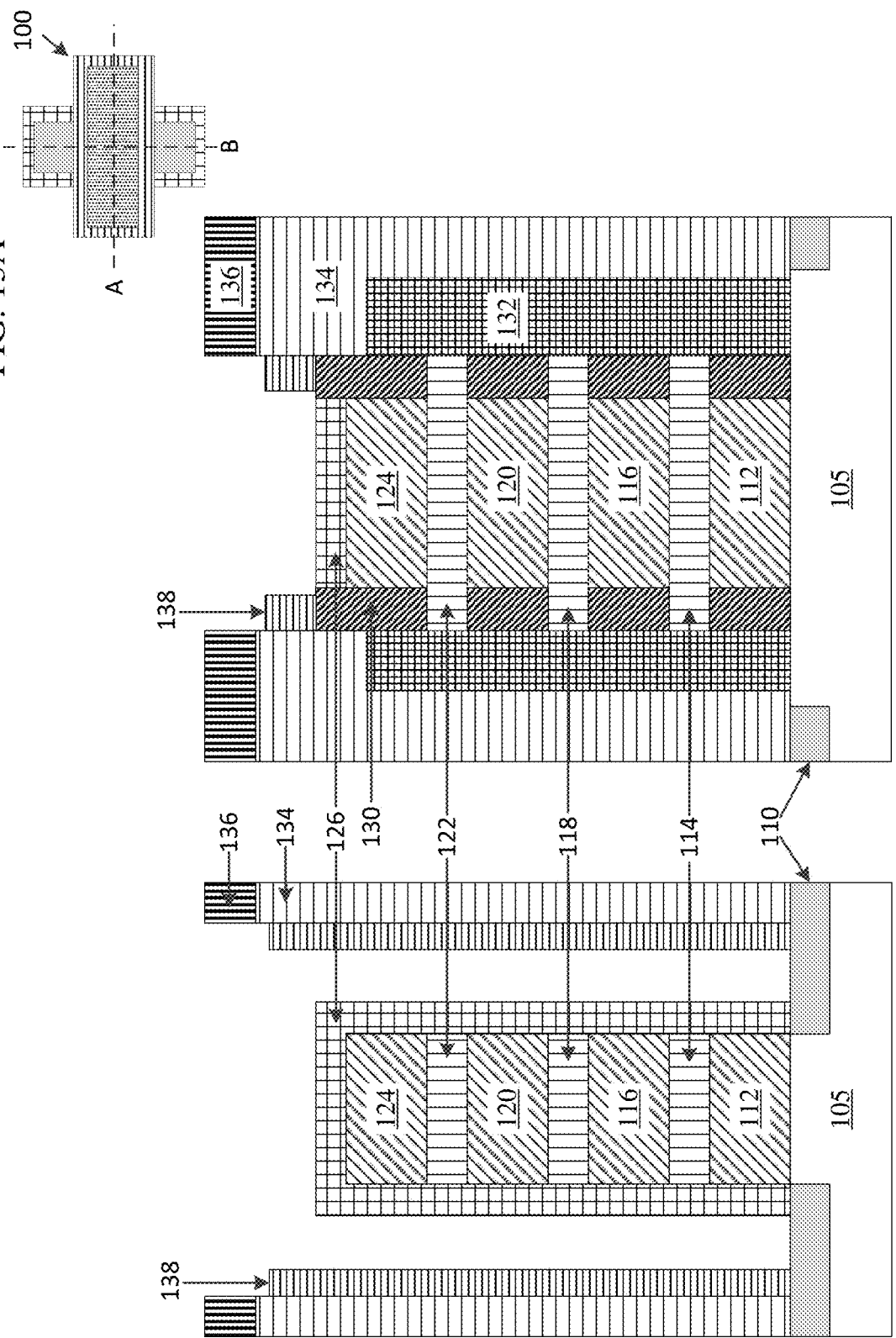

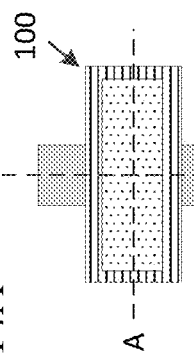
FIG. 14A
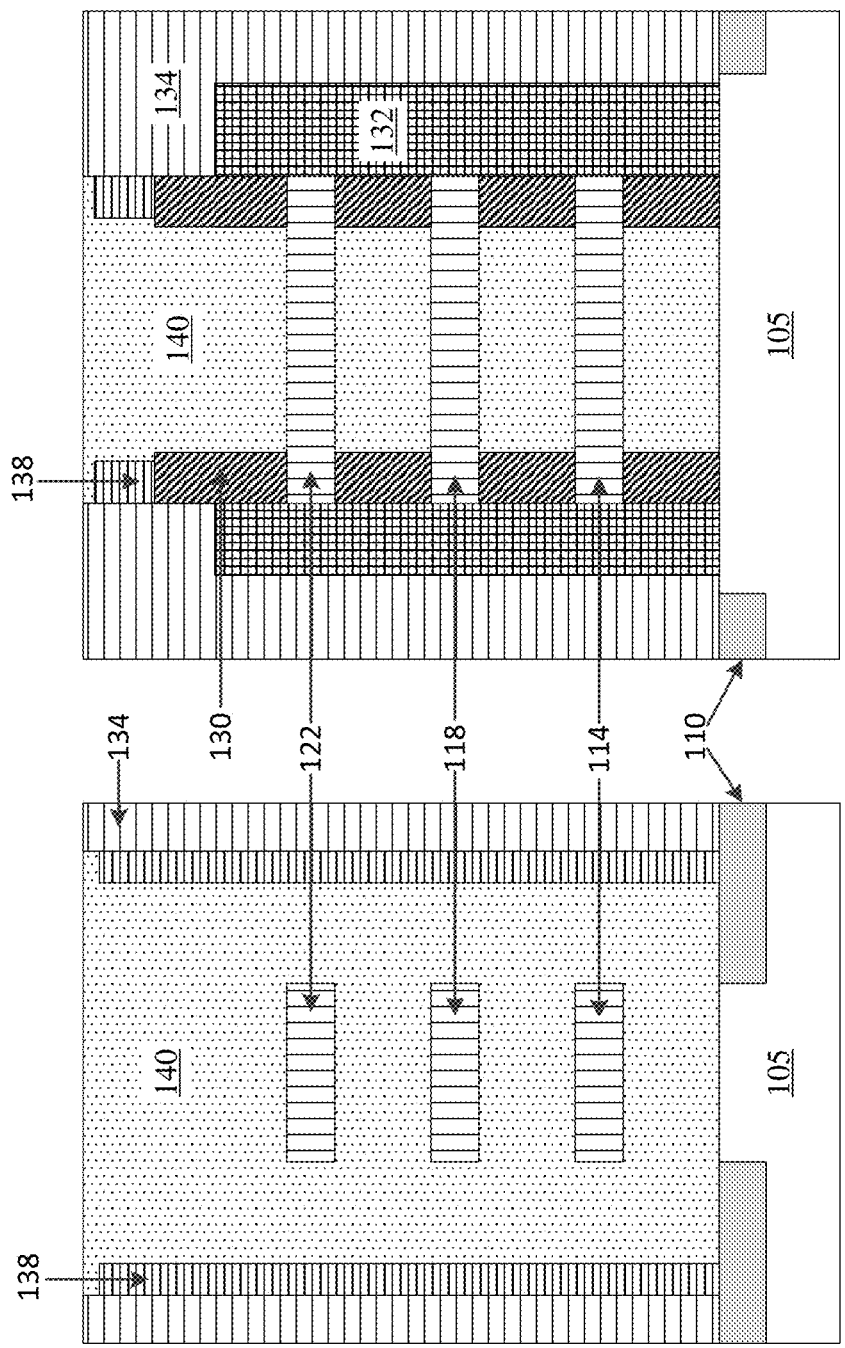
FIG. 14B
FIG. 14C

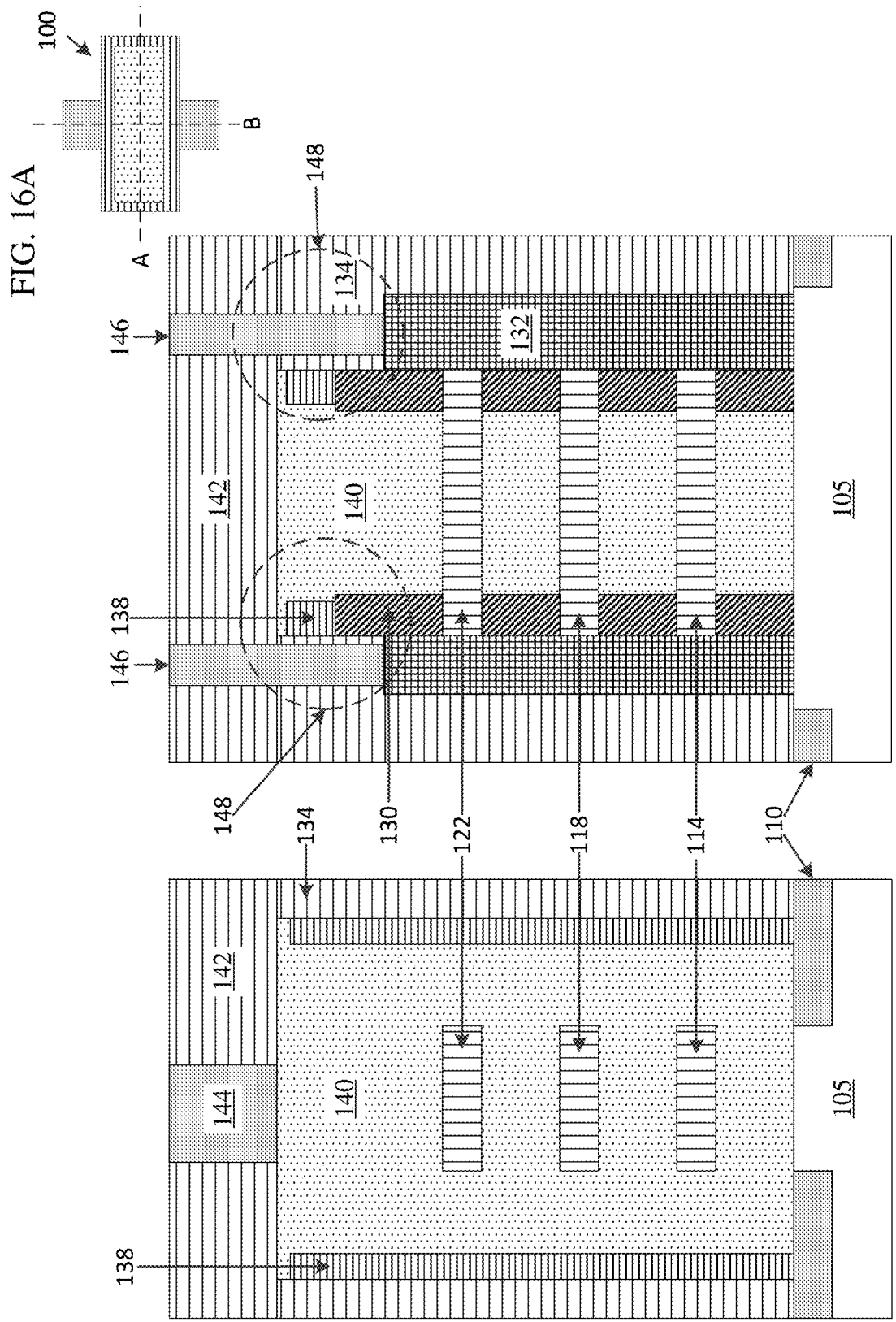

NANOSHEET TRANSISTOR WITH ULTRA LOW-K SPACER AND IMPROVED PATTERNING ROBUSTNESS

BACKGROUND

The present invention generally relates to the field of nanosheet devices, and more particularly to reducing the parasitic capacitance in a nanosheet device.

A parasitic capacitor is formed between components in a nanosheet device. The capacitor affects the performance of the nanosheet device. The fabrication methods to form the necessary components in the nanosheet device prevents the typical solutions to reduce parasitic capacitance from working.

BRIEF SUMMARY

Additional aspects and/or advantages will be set forth in part in the description which follows and, in part, will be apparent from the description, or may be learned by practice of the invention.

A semiconductor device comprising a plurality of nanosheet transistor channels adjacent to a source/drain. An inner spacer located between each of the plurality of nanosheet transistor channels and the inner spacer wraps around the end of each of the plurality of nanosheet transistors, wherein the source/drain is in contact with the inner spacer and each of the plurality of nanosheet transistor channels. A gate surrounding each of the plurality of nanosheet transistor channels and an electrical contact connected to the source/drain. An ultra low-k spacer located between the gate and the source/drain, wherein the ultra low-k spacer reduces the parasitic capacitance of the nanosheet transistor.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 3A illustrates a top-down view of nanosheet device, in accordance with an embodiment of the present invention.

FIG. 3B illustrates cross section A of the nanosheet device, in accordance with the embodiment of the present invention.

FIG. 3C illustrates cross section B of the nanosheet device, in accordance with the embodiment of the present invention.

FIG. 4A illustrates a top-down view of nanosheet device, in accordance with an embodiment of the present invention.

FIG. 4B illustrates cross section A of the nanosheet device, in accordance with the embodiment of the present invention.

FIG. 4C illustrates cross section B of the nanosheet device, in accordance with the embodiment of the present invention.

FIG. 5A illustrates a top-down view of nanosheet device, in accordance with an embodiment of the present invention.

FIG. 5B illustrates cross section A of the nanosheet device, in accordance with the embodiment of the present invention.

FIG. 5C illustrates cross section B of the nanosheet device, in accordance with the embodiment of the present invention.

FIG. 7A illustrates a top-down view of nanosheet device, in accordance with an embodiment of the present invention.

FIG. 7B illustrates cross section A of the nanosheet device, in accordance with the embodiment of the present invention.

FIG. 7C illustrates cross section B of the nanosheet device, in accordance with the embodiment of the present invention.

FIG. 9A illustrates a top-down view of nanosheet device, in accordance with an embodiment of the present invention.

FIG. 9B illustrates cross section A of the nanosheet device, in accordance with the embodiment of the present invention.

FIG. 9C illustrates cross section B of the nanosheet device, in accordance with the embodiment of the present invention.

FIG. 10A illustrates a top-down view of nanosheet device, in accordance with an embodiment of the present invention.

FIG. 10B illustrates cross section A of the nanosheet device, in accordance with the embodiment of the present invention.

FIG. 10C illustrates cross section B of the nanosheet device, in accordance with the embodiment of the present invention.

FIG. 11A illustrates a top-down view of nanosheet device, in accordance with an embodiment of the present invention.

FIG. 11B illustrates cross section A of the nanosheet device, in accordance with the embodiment of the present invention.

FIG. 11C illustrates cross section B of the nanosheet device, in accordance with the embodiment of the present invention.

FIG. 12A illustrates a top-down view of nanosheet device, in accordance with an embodiment of the present invention.

FIG. 12B illustrates cross section A of the nanosheet device, in accordance with the embodiment of the present invention.

FIG. 12C illustrates cross section B of the nanosheet device, in accordance with the embodiment of the present invention.

FIG. 13A illustrates a top-down view of nanosheet device, in accordance with an embodiment of the present invention.

FIG. 13B illustrates cross section A of the nanosheet device, in accordance with the embodiment of the present invention.

FIG. 13C illustrates cross section B of the nanosheet device, in accordance with the embodiment of the present invention.

FIG. 14A illustrates a top-down view of nanosheet device, in accordance with an embodiment of the present invention.

FIG. 14B illustrates cross section A of the nanosheet device, in accordance with the embodiment of the present invention.

FIG. 14C illustrates cross section B of the nanosheet device, in accordance with the embodiment of the present invention.

FIG. 16A illustrates a top-down view of nanosheet device, in accordance with an embodiment of the present invention.

FIG. 16B illustrates cross section A of the nanosheet device, in accordance with the embodiment of the present invention.

FIG. 16C illustrates cross section B of the nanosheet device, in accordance with the embodiment of the present invention.

DETAILED DESCRIPTION

Figure 1A:
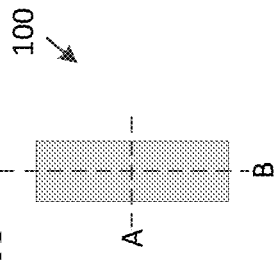
FIG. 1A illustrates a top-down view of nanosheet device, in accordance with an embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating, or semi-conductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various process used to form a micro-chip that will packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (ME), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, wherein like reference numerals refer to like elements throughout. The present invention is directed toward the formation of a nanosheet device, more specifically protecting the multilayered stack during manufacturing process. During manufacturing of the nanosheet device, the multilayer stack can collapse or be damaged due to downstream processing. However, the multilayered stack is protected by a sacrificial layer formed around the multilayered stack.

Additionally, a natural parasitic capacitor occurs between the contacts/source/drain and the metal gate. The capacitance of the natural parasitic capacitor can cause defects/errors in the performance of the nanosheet device. The present invention forms a barrier layer between the components of the naturally formed capacitor. The barrier layer reduces the capacitance of the parasitic capacitor. The barrier layer is comprised of an ultra low-k dielectric. The ultra low-k dielectric is sensitive to the fabrication steps required to produce a nanosheet device, i.e., steps involving high temperature. The high temperature steps can modify or even damage the barrier layer thus preventing/reducing the effectiveness of the barrier layer on the parasitic capacitor. Therefore, the barrier layer is formed towards the end of the fabrication to prevent necessary heating/cooling fabrication stages from damaging the barrier layer.

Figure 1C:
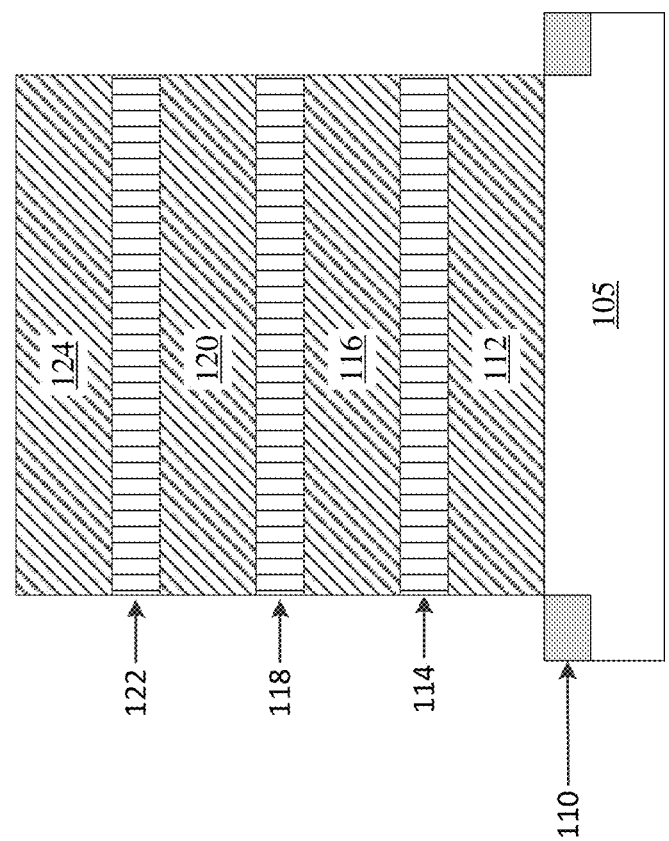
FIG. 1C illustrates cross section B of the nanosheet device, in accordance with the embodiment of the present invention.
Figure 1B:
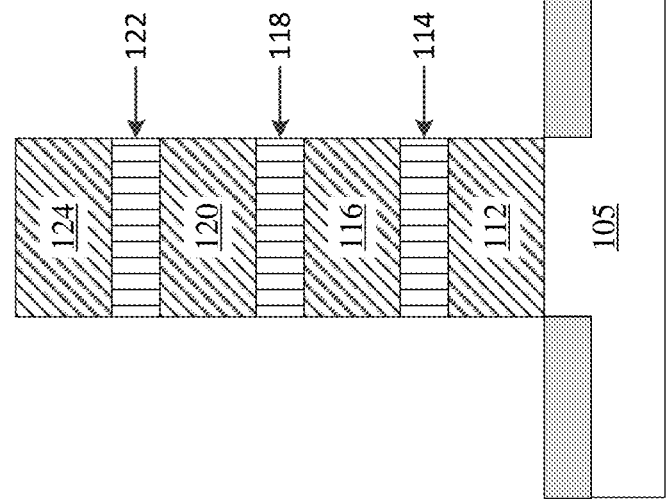
FIG. 1B illustrates cross section A of the nanosheet device, in accordance with the embodiment of the present invention.

FIG. 1A illustrates a top-down view of nanosheet device 100, in accordance with an embodiment of the present invention. FIG. 1B illustrates cross section A of the nanosheet device 100, in accordance with the embodiment of the present invention. FIG. 1C illustrates cross section B of the nanosheet device 100, in accordance with the embodiment of the present invention. The nanosheet device 100 includes a substrate 105 that acts as a base for the nanosheet device 100. The substrate 105 can be, for example, a material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V compound semiconductor or other like semiconductor. In addition, multiple layers of the semiconductor materials can be used as the semiconductor material of the substrate 105. In some embodiments, the substrate 105 includes both semiconductor materials and dielectric materials. The semiconductor substrate 105 may also comprise an organic semiconductor or a layered semiconductor such as, for example, Si/SiGe, a silicon-on-insulator or a SiGe-on-insulator. A portion or entire semiconductor substrate 105 may be amorphous, polycrystalline, or monocrystalline. The semiconductor substrate 105 may be doped, undoped or contain doped regions and undoped regions therein. In some embodiments, the substrate 105 includes other device structures (not shown) such as transistors, isolation structures (such as shallow trench isolations), contacts, conducting wires, etc., or any suitable layer that can act as the base for the nanosheet device 100. The nanosheet device 100 includes a nanosheet stack, where the nanosheet stack is comprise of altering layers of materials. The nanosheet stack includes a first layer 112, a second layer 114, a third layer 116, a fourth layer 118, a fifth layer 120, a sixth layer 122, and a seventh layer 124. The first layer 112, the third layer 116, fifth layer 120, and the seventh layer 124 can be comprised of SiGe 20-50%. The second layer 114, the fourth layer 118, and the sixth layer 122 can be comprised of Si. The second layer 114, the fourth layer 118, and the sixth layer 122 can be epitaxially grown to control the crystalline structure of the layers. Non-limiting thickness of the first layer 112, the third layer 116, fifth layer 120, and the seventh layer 124 can be in the range from 8 nanometers (nm) to 20 nm. Non-limiting thickness of the second layer 114, the fourth layer 118, and the sixth layer 122, can be in the range from 4 nm to 10 nm. FIGS. 1B and 1C illustrate seven layers comprising the nanosheet stack, however, the number of layers illustrated by the Figures is for exemplary purposes only. The nanosheet stack can be comprised of fewer layers or more layers than what is illustrated, as long as the materials that comprise the layers are alternating or are different. FIGS. 1B and 1C illustrate the nanosheet stack after it was etched to reduce the width of the nanosheet stack. The etching process causes a trench to be formed in the substrate 105. A shallow trench isolation (STI) layer 110 is formed in the trench located in the substrate 105.

Figure 2A:
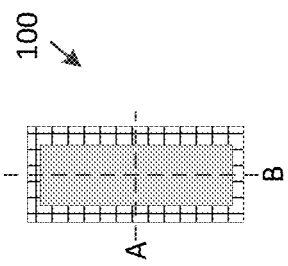
FIG. 2A illustrates a top-down view of nanosheet device, in accordance with an embodiment of the present invention.
Figure 2C:
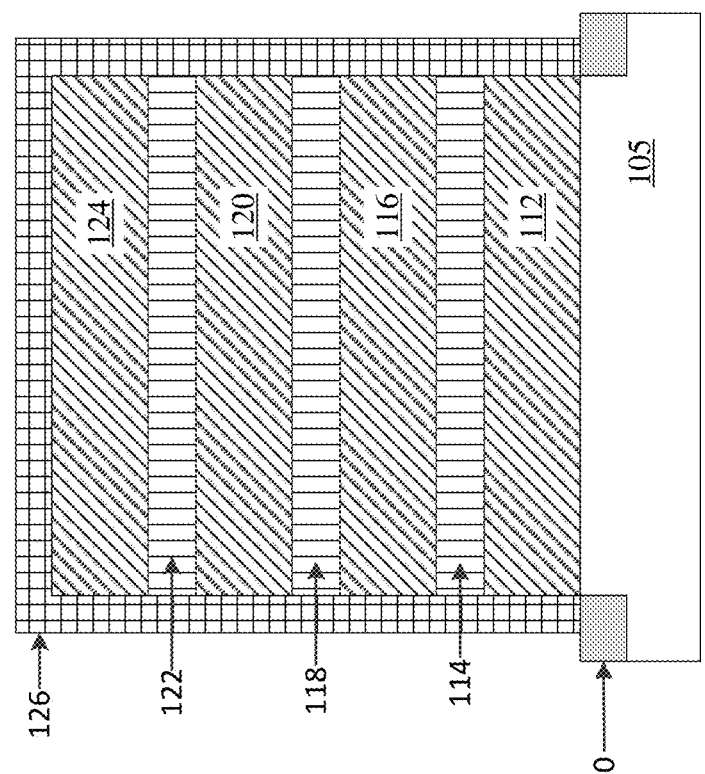
FIG. 2C illustrates cross section B of the nanosheet device, in accordance with the embodiment of the present invention.
Figure 2B:
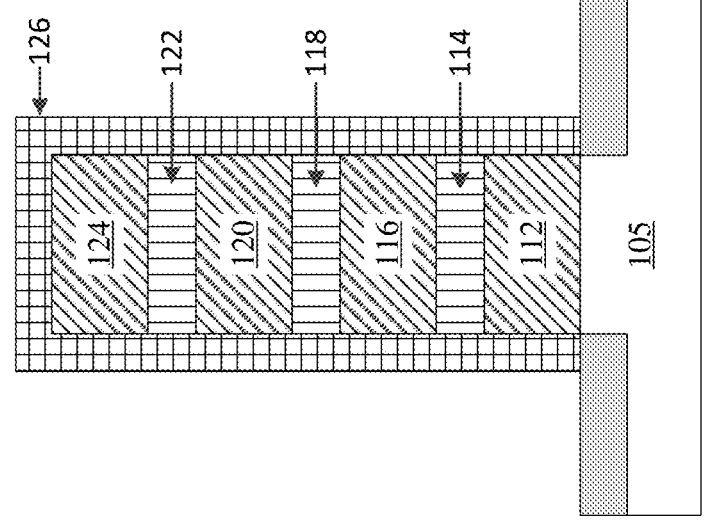
FIG. 2B illustrates cross section A of the nanosheet device, in accordance with the embodiment of the present invention.

FIG. 2A illustrates a top-down view of nanosheet device 100, in accordance with an embodiment of the present invention. FIG. 2B illustrates cross section A of the nanosheet device 100, in accordance with the embodiment of the present invention. FIG. 2C illustrates cross section B of the nanosheet device 100, in accordance with the embodiment of the present invention. A sacrificial layer 126 is formed on the exposed surfaces of the nanosheet device 100. The sacrificial layer 126 protects the nanosheet stack from collapsing and/or other damages from downstream manufacturing stages. For example, the sacrificial layer 126 can be formed by epitaxy and comprised of, for example, SiGe. By using epitaxy, the sacrificial layer 126 is grown only on semiconductor layers (for example, the first layer 112, the second layer 114, the third layer 116, the fourth layer 118, the fifth layer 120, the sixth layer 122, and the seventh layer 124), but not on dielectric material (for example, the STI layer 110). Therefore, no extra etching process is needed for forming the sacrificial layer 126 around the nanosheet stack. A non-limiting thickness of the sacrificial layer 126 is about 6 nm.

FIG. 3A illustrates a top-down view of nanosheet device 100, in accordance with an embodiment of the present invention. FIG. 3B illustrates cross section A of the nanosheet device 100, in accordance with the embodiment of the present invention. FIG. 3C illustrates cross section B of the nanosheet device 100, in accordance with the embodiment of the present invention. A dummy gate 128 is formed on the shallow trench isolation layer 110 and on top of the sacrificial layer 126. The dummy gate 128 encloses three sides of the nanosheet stack as illustrated by FIG. 3B. As illustrated by FIG. 3C, the dummy gate 128 is located on top of the sacrificial layer 126. In an embodiment, the lateral width of dummy gate 128 as shown in FIG. 3C is set to be the sum of the final gate length and two times of the thickness of spacers formed later. As an example, the final gate length can be about 16 nm and the spacer thickness can be 6 nm, leading to 28 nm of the lateral width of dummy gate 128 in FIG. 3C. The dummy gate 128 typically has a vertical height (see FIG. 3B) of about 200 nm. If the dummy gate 128 lateral width is the same as the final gate length (e.g., 16 nm), the aspect ratio of the dummy gate 128 (the ratio between the vertical gate height and the lateral gate width) is 12.5. Such a high aspect ratio may cause the structure prone to collapsing. By increasing the lateral width of the dummy gate 128 to include both the final gate length and two times of the spacer thickness, the dummy gate 128 lateral width is increased to 28 nm and thus the gate aspect ratio is reduced to about 7.1. The reduction of dummy gate 128 aspect ratio advantageously improves the structural stability. The dummy gate 128 can include amorphous carbon or any other suitable material such as silicon nitride.

FIG. 4A illustrates a top-down view of nanosheet device 100, in accordance with an embodiment of the present invention. FIG. 4B illustrates cross section A of the nanosheet device 100, in accordance with the embodiment of the present invention. FIG. 4C illustrates cross section B of the nanosheet device 100, in accordance with the embodiment of the present invention. The nanosheet stack is etched to reduce the width of the nanosheet stack. The etched width of the nanosheet stack can match the width of the dummy gate 128 located on top of the sacrificial layer 126 as illustrated by FIG. 4C, or the etched width of the nanosheet stack can be any desired width.

FIG. 5A illustrates a top-down view of nanosheet device 100, in accordance with an embodiment of the present invention. FIG. 5B illustrates cross section A of the nanosheet device 100, in accordance with the embodiment of the present invention. FIG. 5C illustrates cross section B of the nanosheet device 100, in accordance with the embodiment of the present invention. The exposed sides of the nanosheet stack allows for fabrications steps to be applied to the layers of the stack. The first layer 112, the third layer 116, the fifth layer 120, the seventh layer 124, and the sacrificial layer 126 are recessed back, thus reducing the width of these layers. The width of the second layer 114, the fourth layer 118, the sixth layer 122, and the dummy gate 128 is maintained. The recessing process creates gaps between second layer 114, the fourth layer 118, the sixth layer 122, and the dummy gate 128. The recessing steps exposes portions of the top and bottom of the second layer 114, the fourth layer 118, the sixth layer 122, as illustrated by FIG. 5C. In one embodiment, the first layer 112, the third layer 116, the fifth layer 120, the seventh layer 124, and the sacrificial layer 126 are SiGe and are recessed by using a gas phase etch process comprising hydrogen chloride (HCl). Alternatively, an aqueous etch containing a mix of ammonia and hydrogen peroxide can be used to selectively etch SiGe.

Figure 6A:
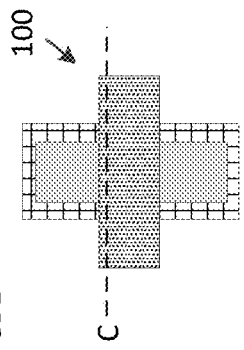
FIG. 6A illustrates a top-down view of nanosheet device, in accordance with an embodiment of the present invention.
Figure 6B:
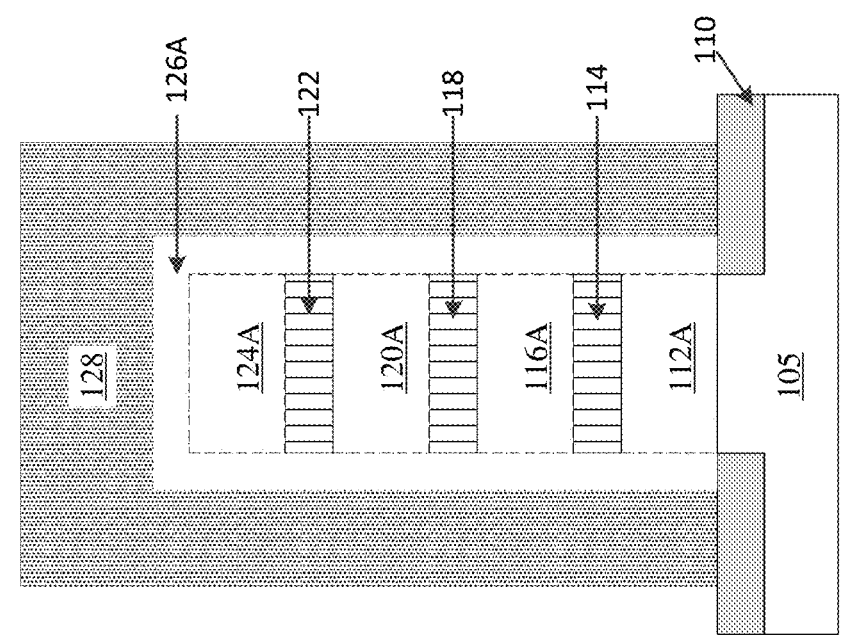
FIG. 6B illustrates cross section C of the nanosheet device, in accordance with the embodiment of the present invention.

FIG. 6A illustrates a top-down view of nanosheet device 100, in accordance with an embodiment of the present invention. FIG. 6B illustrates cross section C of the nanosheet device 100, in accordance with the embodiment of the present invention. FIG. 6B illustrates a different perspective of the nanosheet stack more specifically FIG. 6B illustrates the edge of the nanosheet stack. The dashed outlines emphasize the layers that were recessed and are no longer present at that the edge of the nanosheet stack. In an embodiment, the sacrificial layer 126A, the first layer 112A, the third layer 116A, the fifth layer 120A, and the seventh layer 124A comprise the same material (e.g., SiGe). The dashed lines for sacrificial layer 126A, the first layer 112A, the third layer 116A, the fifth layer 120A, and the seventh layer 124A illustrate where the material for those layers were recessed together, thus these layers no longer extend to the edge of the nanosheet stack after recessing.

FIG. 7A illustrates a top-down view of nanosheet device 100, in accordance with an embodiment of the present invention. FIG. 7B illustrates cross section A of the nanosheet device 100, in accordance with the embodiment of the present invention. FIG. 7C illustrates cross section B of the nanosheet device 100, in accordance with the embodiment of the present invention. An inner spacer 130 is formed in the recessed areas above and below the second layer 114, the fourth layer 118, the sixth layer 122. In an embodiment, the inner spacer is formed by a conformal deposition such as chemical vapor deposition (CVD) or atomic layer deposition (ALD) followed by an etch-back process. The inner spacer 130 can be comprised of a dielectric material, such as, SiOCN.

Figure 8A:
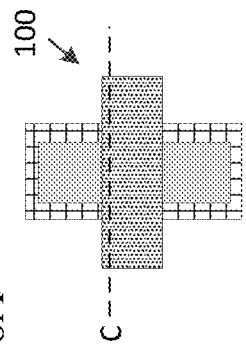
FIG. 8A illustrates a top-down view of nanosheet device, in accordance with an embodiment of the present invention.
Figure 8B:
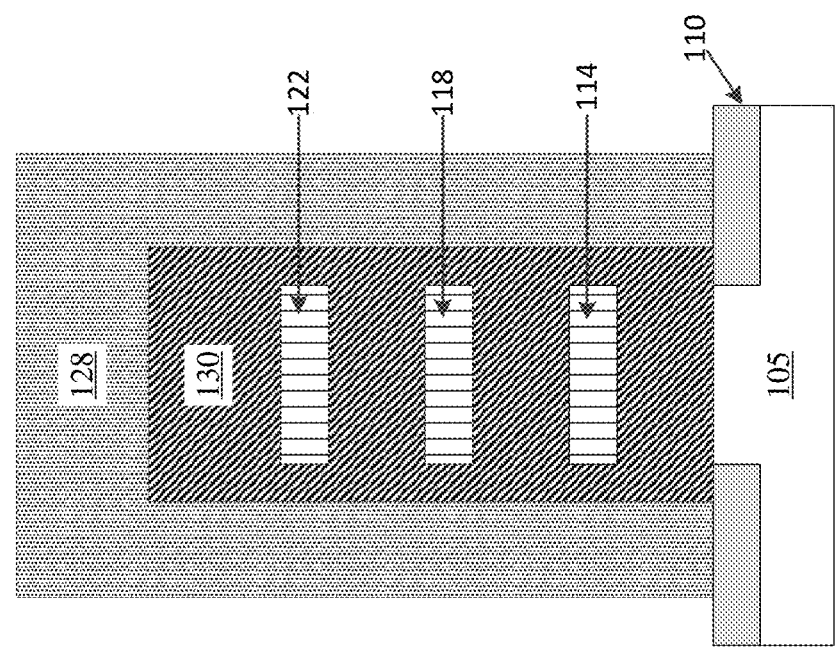
FIG. 8B illustrates cross section C of the nanosheet device, in accordance with the embodiment of the present invention.

FIG. 8A illustrates a top-down view of nanosheet device 100, in accordance with an embodiment of the present invention. FIG. 8B illustrates cross section C of the nanosheet device 100, in accordance with the embodiment of the present invention. FIG. 8B illustrates that the inner spacer 130 wraps around the edges of the second layer 114, the fourth layer 118, the sixth layer 122. The inner spacer 130 is in contact with at least four sides of each of the second layer 114, the fourth layer 118, the sixth layer 122.

FIG. 9A illustrates a top-down view of nanosheet device 100, in accordance with an embodiment of the present invention. FIG. 9B illustrates cross section A of the nanosheet device 100, in accordance with the embodiment of the present invention. FIG. 9C illustrates cross section B of the nanosheet device 100, in accordance with the embodiment of the present invention. A source/drain 132 is epitaxially grown from the exposed surface of the second layer 114, fourth layer 118, the sixth layer 122, and the substrate 105 (when the substrate 205 is comprised of a suitable material for epitaxially growing the source/drain 132). The source/drain 132 is in direct contact with a sidewall of the inner spacer 130, the second layer 114, the fourth layer 118, the sixth layer 122, and the substrate 105. In one embodiment, the source/drain 132 is formed by in-situ epitaxy, meaning dopants are incorporated to the source/drain during the epitaxy process. For n-type transistors, an n-type dopant selected from a group of phosphorus (P), arsenic (As) and/or antimony (Sb) can be used. For p-type transistors, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

FIG. 10A illustrates a top-down view of nanosheet device 100, in accordance with an embodiment of the present invention. FIG. 10B illustrates cross section A of the nanosheet device 100, in accordance with the embodiment of the present invention. FIG. 10C illustrates cross section B of the nanosheet device 100, in accordance with the embodiment of the present invention. As illustrated by FIG. 10B, a first inter layered dielectric (ILD) layer 134 is formed along the side of the dummy gate 128. The first ILD layer 134 forms walls that extend the from the trench isolation layer 110 to the top of the dummy gate 128. As illustrated by FIG. 10C, the first ILD layer 134 is formed on top of the shallow trench isolation layer 110, the substrate 105, and the source/drain 132. The first ILD layer 134 is in contact with the sidewalls of the source/drain 132, the dummy gate 128, and possible a sidewall of the inner spacer 130 (depending on how high the source/drain 132 extends). In an embodiment, the ILD layer 134 is comprised of silicon oxide. In some embodiments, the ILD layer 134 may comprise multiple layered materials (not shown).

FIG. 11A illustrates a top-down view of nanosheet device 100, in accordance with an embodiment of the present invention. FIG. 11B illustrates cross section A of the nanosheet device 100, in accordance with the embodiment of the present invention. FIG. 11C illustrates cross section B of the nanosheet device 100, in accordance with the embodiment of the present invention. The first ILD layer 134 is recessed/lowered at its top surface to make a trench/ledge. A cap 136 deposited and planarized so it is formed on top of the first ILD layer 134 in the trench/ledge. The cap 136 protects the first ILD layer 134 from damage from downstream fabrication stages. The cap 136 can be comprised of, for example, TiN.

FIG. 12A illustrates a top-down view of nanosheet device 100, in accordance with an embodiment of the present invention. FIG. 12B illustrates cross section A of the nanosheet device 100, in accordance with the embodiment of the present invention. FIG. 12C illustrates cross section B of the nanosheet device 100, in accordance with the embodiment of the present invention. The dummy gate 128 is removed as illustrated by FIGS. 12B and 12C. The sacrificial layer 126 is exposed by the removal of the dummy gate 128. As illustrated by FIG. 12B, a gap is formed by the removal of the dummy gate 128, where the gap extends from each of the first ILD layers 134 to the sacrificial layer 126. The gap further extends between the each of the first ILD layers 134 above the sacrificial layer 126. As illustrated by FIG. 12C, a gap is formed between the first ILD layer 134 and the cap 136 by the removal of the dummy gate 128. In the case that the dummy gate 128 is comprised of amorphous carbon, it can be removed by oxygen plasma etching or any other suitable process.

FIG. 13A illustrates a top-down view of nanosheet device 100, in accordance with an embodiment of the present invention. FIG. 13B illustrates cross section A of the nanosheet device 100, in accordance with the embodiment of the present invention. FIG. 13C illustrates cross section B of the nanosheet device 100, in accordance with the embodiment of the present invention. An ultra low-k layer 138 is formed on the exposed surfaces and the ultra low-k layer 138 is etched by the means of a reactive ion etching process to remove most of the deposited ultra low-k layer 138. The remaining ultra low-k layer 138 extends along the height of the first ILD layer 134, as illustrated by FIG. 13B. The ultra low-k layer 138 is a dielectric layer that can be comprised of SiO:C. As illustrated by FIG. 13B, there is a gap between the sidewall of the ultra low-k layer 138 and the sacrificial layer 126. As illustrated by FIG. 12C, the ultra low-k layer 138 is formed on top of the exposed surfaces and the ultra low-k layer 138 is etched to remove most of the material. The ultra low-k layer 138 remains on top of the inner spacer 130 and extends up the sidewall of the first ILD layer 134. The ultra low-k layer 138 is formed by a conformal deposition process such as CVD or ALD followed by a directional etch process such as reactive ion etch (ME). The cap 136 protects the underlying ILD layer 134 during the ME process. In some embodiments, the relative dielectric constant of the ultra low-k layer 138 ranges from 1.5 to 3.5, and more preferably from 2.2 to 3.0. Non-limiting thickness of the ultra low-k layer 138 ranges from 4 nm to 8 nm.

FIG. 14A illustrates a top-down view of nanosheet device 100, in accordance with an embodiment of the present invention. FIG. 14B illustrates cross section A of the nanosheet device 100, in accordance with the embodiment of the present invention. FIG. 14C illustrates cross section B of the nanosheet device 100, in accordance with the embodiment of the present invention. The sacrificial layer 126 is removed to expose the underlying nanosheet stack. A real gate 140 is formed in the gap between the ultra low-k layer 138, and the real gate 140 is substituted for the first layer 112, the third layer 116, the fifth layer 120, and the seventh layer 124. The real gate 140 is formed all around each of the remaining layers of the nanosheet stack. Thus, the high-k metal gate 140 encloses the second layer 114, the fourth layer 118, and the sixth layer 122. The cap 136 and the real gate 140 are planarized to remove the cap 136 and any excess real gate 140 material. The planarization step forms a uniform top surface along the top of the first ILD layer 134 and the top of the real gate 140. As illustrated by FIG. 14B a portion of the ultra low-k layer 138 is between the real gate 140 and the first ILD layer 134, where the ultra low k layer 138 extends along the height of the real gate 140. As illustrated by FIG. 14C, the real gate 140 is substituted for each the first layer 112, the third layer 116, the fifth layer 120, and the seventh layer 124. Thus, the real gate 140 fills the space between the inner spacers 130. Furthermore, the real gate 150 fills in the gap between the inner spacers 130 on top of the sixth layer 122, and between the ultra low-k layer 138. As illustrated by FIG. 14C, a portion of the ultra low-k layer 138 is between the real gate 140 and the first ILD layer 134, so that ultra low-k layer 138 will be between an electric contact 146 (as described below) and the real gate 140.

Although shown as one layer for simplicity, the real gate 140 can comprise multiple layers of materials such as a gate dielectric layer around the nanosheet channels, and a gate conductor around the gate dielectric. The gate dielectric can comprise any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum, magnesium. The gate dielectric material can be formed by any suitable process or any suitable combination of multiple processes, including but not limited to, thermal oxidation, chemical oxidation, thermal nitridation, plasma oxidation, plasma nitridation, atomic layer deposition (ALD), chemical vapor deposition (CVD), etc. In some embodiments, the gate dielectric has a thickness ranging from 1 nm to 5 nm, although less thickness and greater thickness are also conceived. The gate conductor can comprise any suitable conducting material, including but not limited to, doped polycrystalline or amorphous silicon, germanium, silicon germanium, a metal (e.g., tungsten (W), titanium (Ti), tantalum (Ta), ruthenium (Ru), hafnium (Hf), zirconium (Zr), cobalt (Co), nickel (Ni), copper (Cu), aluminum (Al), platinum (Pt), tin (Sn), silver (Ag), gold (Au), a conducting metallic compound material (e.g., tantalum nitride (TaN), titanium nitride (TiN), tantalum carbide (TaC), titanium carbide (TiC), titanium aluminum carbide (TiAlC), tungsten silicide (WSi), tungsten nitride (WN), ruthenium oxide (RuO2), cobalt silicide (CoSi), nickel silicide (NiSi)), transition metal aluminides (e.g. Ti3Al, ZrAl), TaC, TaMgC, carbon nanotube, conductive carbon, graphene, or any suitable combination of these materials. The conductive material may further comprise dopants that are incorporated during or after deposition. In some embodiments, the gate may further comprise a workfunction setting layer between the gate dielectric and gate conductor. The workfunction setting layer can be a workfunction metal (WFM). WFM can be any suitable material, including but not limited a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and WFM. The gate conductor and WFM can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

Figure 15A:
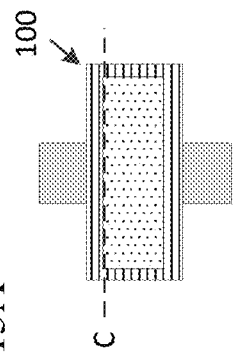
FIG. 15A illustrates a top-down view of nanosheet device, in accordance with an embodiment of the present invention.
Figure 15B:
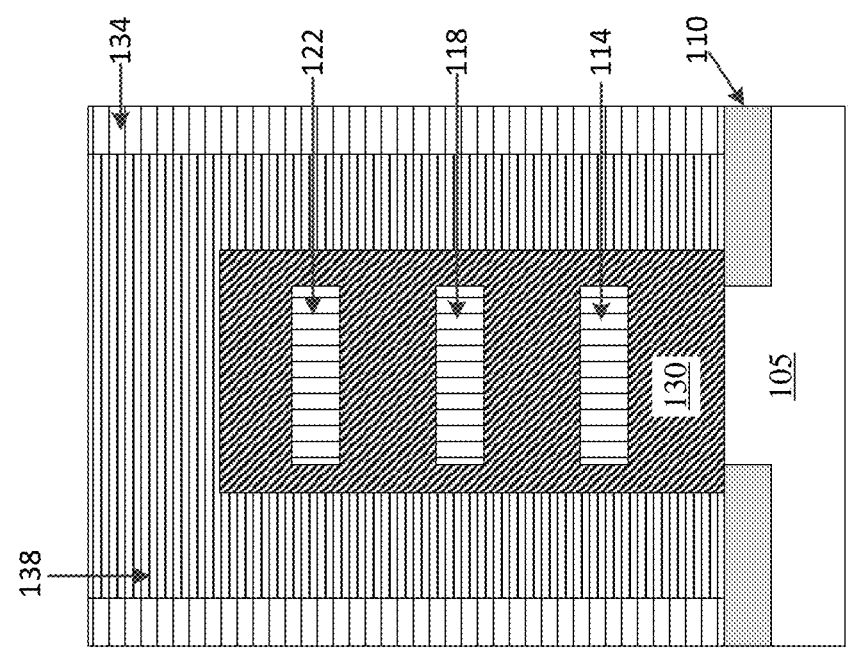
FIG. 15B illustrates cross section C of the nanosheet device, in accordance with the embodiment of the present invention.

FIG. 15A illustrates a top-down view of nanosheet device 100, in accordance with an embodiment of the present invention. FIG. 15B illustrates cross section C of the nanosheet device 100, in accordance with the embodiment of the present invention. FIG. 15B illustrates a different perspective of the nanosheet stack after the real gate 140 was added. The inner spacer 130 encloses the second layer 114, the fourth layer 118, and the sixth layer 122. The inner spacer 130 also wraps at the ends of second layer 114, the fourth layer 118 and the sixth layer 122. The ultra low-k layer 138 is formed on three sides of the inner spacer 130 and fills the gap between the first ILD layer 134 and the inner spacer 130.

FIG. 16A illustrates a top-down view of nanosheet device 100, in accordance with an embodiment of the present invention. FIG. 16B illustrates cross section A of the nanosheet device 100, in accordance with the embodiment of the present invention. FIG. 16C illustrates cross section B of the nanosheet device 100, in accordance with the embodiment of the present invention. As illustrated by FIG. 16B, a second ILD layer 142 is formed on top of the real gate 140 and on top of the first ILD layer 134. An electrical contact 144 is passed through the second ILD layer 142, where the electrical contact 144 is in direct contact with the top of the real gate 140.

As illustrated by FIG. 16C, a second ILD layer 142 is formed on top of the first ILD layer 134 and the real gate 140. An electrical contact 146 is passed through the second ILD layer 142 and the first ILD layer 134, so that the electrical contact is directly connected to the source/drain 132. Dashed circles 148 illustrates locations where a parasitic natural capacitor is formed between the electrical contact 146 and the real gate 140. The ultra low-k layer 138 is located between the electrical contact 146 and the real gate 140. The ultra low-k layer 138 acts as an inhibitor to the parasitic natural capacitor, thus the ultra low-k layer 138 reduces the capacitance of the parasitic natural capacitor.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A semiconductor device comprising:
a plurality of nanosheet transistor channels adjacent to a source/drain;
an inner spacer located between each of the plurality of nanosheet transistor channels, wherein the inner spacer wraps around each edge of each of the plurality of nanosheet transistors, and wherein the source/drain is in contact with the inner spacer and each of the plurality of nanosheet transistor channels;

a gate surrounding each of the plurality of nanosheet transistor channels;

an electrical contact connected to the source/drain; and an ultra low-k spacer located between the gate and the electrical contact, wherein the ultra low-k spacer is located directly on top of a portion of the inner spacer, wherein the ultra low-k spacer reduces a parasitic capacitance between the gate and the electrical contact.

2. The semiconductor device of claim 1, wherein the ultra low-k spacer has a relative dielectric constant between 2.2 and 3.0.

3. The semiconductor device of claim 1, wherein the ultra low-k spacer is comprised of SiO:C.

4. The semiconductor device of claim 1, wherein a first portion of the inner spacer is surrounding a portion of each of the plurality of nanosheet transistor channels.

5. The semiconductor device of claim 4, wherein a first portion of the ultra low-k spacer is in direct contacted with three sides of the first portion of the inner spacer.

6. The semiconductor device of claim 5, further comprising:
an inter layered dielectric located adjacent to a side of the first portion of the ultra low-k spacer.

7. The semiconductor device of claim 6, wherein the inter layered dielectric extends along the height of the first portion of the ultra low-k dielectric.

8. The semiconductor device of claim 1, wherein a second portion of the ultra low-k spacer is in direct contact with the gate, and wherein the second portion of the ultra low-k spacer extends along the height of the gate.

9. The semiconductor device of claim 8, further comprising:
a first inter layered dielectric located adjacent the second portion of ultra low-k spacer.

10. The semiconductor device of claim 9, further comprising:
a second inter layered dielectric located on top of the gate and a first inter layered dielectric.

11. The semiconductor device of claim 10, further comprising:
a second electrical contact passing through the second inter layered dielectric, wherein the second electrical contact is connected to the gate.

12. A semiconductor device comprising:
a base comprised of a substrate and a shallow trench isolation material;
a first portion of an inner spacer is located on top of the base;
a first nanosheet transistor channel located on top of the first portion of the inner spacer, wherein the first portion of the inner spacer is in contact with the base and a bottom of the first nanosheet transistor channel;
a second portion of the inner spacer is located on top of the first nanosheet transistor channel;
a second nanosheet transistor channel located on top of the second portion of the inner spacer, wherein the second portion of the inner spacer is in contact with a top of the first nanosheet transistor channel and a bottom of the second nanosheet transistor channel;
a third portion of the inner spacer is located on top of the second nanosheet transistor channel;
a third nanosheet transistor channel located on top of the third portion of the inner spacer, wherein the third portion of the inner spacer is in contact with the top of the second nanosheet transistor channel and a bottom of the third nanosheet transistor channel;
a fourth portion of the inner spacer is located on top of the third nanosheet transistor channel;
a first portion of an ultra low-k spacer is located on top of the fourth portion of the inner spacer, wherein the first portion of the ultra low-k spacer is in direct contact with a top surface of the fourth portion of the inner spacer;
a portion of a gate is located above and below each of the first nanosheet transistor channel, the second nanosheet transistor channel, and the third nanosheet transistor channel;
a source/drain located adjacent to the inner spacer and each of the first nanosheet transistor channel, the second nanosheet transistor channel, and the third nanosheet transistor channel; and
an electrical contact extends through the semiconductor device to connected with the source/drain, wherein the electrical contact and the gate form a parasitic natural capacitor, wherein the first portion of the ultra low-k located on top of the fourth portion of the inner spacer reduces a capacitance of the parasitic natural capacitor.

13. The semiconductor device of claim 12, wherein the ultra low-k spacer is comprised of SiO:C.

14. The semiconductor device of claim 12, wherein the first portion of the inner spacer, the second portion of the inner spacer, third portion of the inner spacer and the fourth portion of the inner spacer combine to surround the first nanosheet transistor channel, the second nanosheet transistor channel, and the third nanosheet transistor channel.

15. The semiconductor device of claim 14, wherein a second portion of the ultra low-k spacer is in direct with the sides of the combined inner spacer.

16. The semiconductor device of claim 15, wherein the first portion of the ultra low-k spacer and the second portion of the ultra low-k spacer combine, so that, the combined ultra low-k spacer is located on three sides of the combined inner spacer.

17. The semiconductor device of claim 16, further comprising:
an inter layered dielectric located adjacent to a side of the combined ultra low-k spacer.

18. A semiconductor device comprising:
a base comprised of a substrate and a shallow trench filler material;
a plurality of nanosheet transistor channel located above the base;
a gate surround each of the plurality of nanosheet channels; and
an ultra low-k spacer located adjacent to the gate, wherein the ultra low-k spacer extends from the base to the top of the gate, wherein the gate is located between the ultra low-k spacer and the plurality of nanosheet channels, wherein the gate is in direct contact with both the ultra low-k spacer and the plurality of channel layers.

19. The semiconductor device of claim 18, further comprising:
a first inter layered dielectric located adjacent the ultra low-k spacer.

20. The semiconductor device of claim 19, further comprising:
a second inter layered dielectric located on top of the gate and the first inter layered dielectric; and a second electrical contact passing through the second inter layered dielectric, wherein the second electrical contact is connected to the gate.

* * * * *